(12) United States Patent
Davies

(10) Patent No.: US 6,502,119 B1
(45) Date of Patent: Dec. 31, 2002

(54) HIGH SPEED MICROPROCESSOR ZERO DETECTION CIRCUIT WITH 32-BIT AND 64-BIT MODES

(75) Inventor: Andrew Douglas Davies, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,052

(22) Filed: Sep. 21, 1999

(51) Int. Cl.[7] .................................................. G06F 7/00
(52) U.S. Cl. ........................................ 708/525; 708/518
(58) Field of Search ................................ 708/525, 518, 708/200

(56) References Cited

U.S. PATENT DOCUMENTS

| | | | | |
|---|---|---|---|---|
| 2,905,383 A | * | 9/1959 | Bruce, Jr. .................... 708/525 |
| 5,469,377 A | * | 11/1995 | Amano ........................ 708/525 |
| 5,638,312 A | * | 6/1997 | Simone ....................... 708/525 |
| 5,661,675 A | * | 8/1997 | Chin et al. .................. 708/525 |
| 5,862,066 A | * | 1/1999 | Rossin et al. ............... 708/525 |

* cited by examiner

Primary Examiner—David H. Malzahn
(74) Attorney, Agent, or Firm—Joan Pennington

(57) ABSTRACT

A zero-detection circuit is provided. The zero-detection circuit includes a plurality of transistor stacks. Each transistor stack includes an input transistor and a clocked transistor. Each of the plurality of input transistors receives a data input. An intermediate node is connected to the input transistor stacks. An output stage is coupled to the intermediate node providing an output. The output stage includes a bit selection control circuit receiving a bit selection signal. The bit selection control circuit provides a zero level output of the output stage responsive to a predefined bit selection signal. The transistor stacks comprise silicon-on-insulator (SOI) transistors.

10 Claims, 4 Drawing Sheets

HIGH SPEED MICROPROCESSOR ZERO DETECTION CIRCUIT WITH 32-BIT AND 64-BIT MODES

FIELD OF THE INVENTION

The present invention relates to a high speed microprocessor zero detection circuit with 32-bit and 64-bit modes.

DESCRIPTION OF THE RELATED ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

As shown in FIG. 1, SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology faster MOS transistors can be manufactured resulting in higher performance semiconductors for faster electronic devices.

Referring to FIGS. 1 and 2, there is shown the SOI FET and the parasitic bipolar device. With SOI FETs, by placing a MOS transistor on top of a SOI layer, the MOS transistor is actually placed in parallel with a bipolar junction transistor, as illustrated in FIG. 2. If enough current is passed through the MOS transistor, the parasitic bipolar transistor will turn on. The parasitic bipolar transistor has a small current gain.

Normally, parasitic bipolar action does not manifest itself in conventional, bulk, NMOS transistors because the base of the bipolar transistor is always kept at ground potential, keeping the bipolar transistor turned off. In conventional, bulk, PMOS transistors the body of the PFET is tied to a supply rail Vdd. In the SOI FET, the body (B) of the MOS FET device, or base of the bipolar transistor, is floating and can be charged high by junction leakages induced when both drain (D) and source (S) terminals of the MOS FET are at a high potential. Subsequently, if the source (S) is pulled to a low potential, the trapped charge in the base area (B) is available as parasitic base current. The parasitic base current activates the bipolar transistor and generates a collector current at the drain terminal of the MOS FET.

In Arithmetic Logic Units (ALUs) it is necessary to set a condition code register after an arithmetic operation to specify whether or not the result of the operation was zero. The circuits that accomplish this are typically critical timing paths of the microprocessor. A complication is that the ALU must support not only 64-bit data, but also 32-bit data in order to maintain backward compatibility with previous generations of microprocessors.

FIG. 3 shows a typical Domino circuit that would be used as part of a large circuit implementing this function. If zero detection on only 32 bits of the 64-bit datum is desired, the MODE64 signal will be set to 0 on some instances of this circuit, thus disabling the other 32-bits that are not to be included in the computation. This feature is also very important in improving the testability of the Zero-Detection circuit. It is very difficult to make this circuit work with Silicon-on-Insulator (SOI) technology because the bipolar discharge problem associated with SOI technology is very severe for this particular topology.

The 32/64-bit selection has to be included in the NFET tree via transistors T0 to TN, which introduces the bipolar discharge problem because the bodies of transistors N0 through NN can now be charged to the power supply. The number of NMOS transistor stacks, N in FIG. 3, must be large because when the entire circuit is put together it must cover all 64 bits of the datum. N will be anywhere from 4 to 16, which makes the bipolar discharge problem severe, and because the transistors in the stack must be very large to meet the timing requirements, the problem is even more severe. The resulting error from the bipolar discharge is that node PRE may be accidentally discharged, thus giving an incorrect result in the machine.

SUMMARY OF THE INVENTION

A principal object of the present invention is to provide a zero-detection circuit. Other objects are to provide such a zero-detection circuit substantially without negative effects and that overcomes many of the disadvantages of prior art arrangements.

In brief, a zero-detection circuit is provided. The zero-detection circuit includes a plurality of transistor stacks. Each transistor stack includes an input transistor and a clocked transistor. Each of the plurality of input transistors receives a data input. An intermediate node is connected to the input transistor stacks. An output stage is coupled to the intermediate node providing an output. The output stage includes a bit selection control circuit receiving a bit selection signal. The bit selection control circuit provides a zero level output of the output stage responsive to a predefined bit selection signal.

In accordance with features of the invention, the transistor stacks comprise silicon-on-insulator (SOI) transistors.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
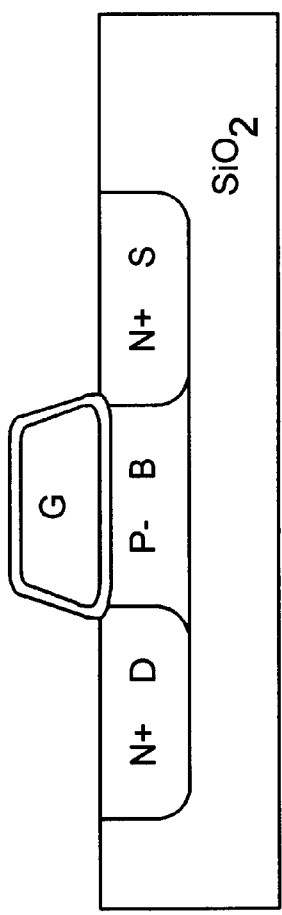
FIG. 1 is a cross sectional view illustrating a conventional silicon-on-insulator (SOI) N-channel field effect transistor (NFET)
Figure 2:
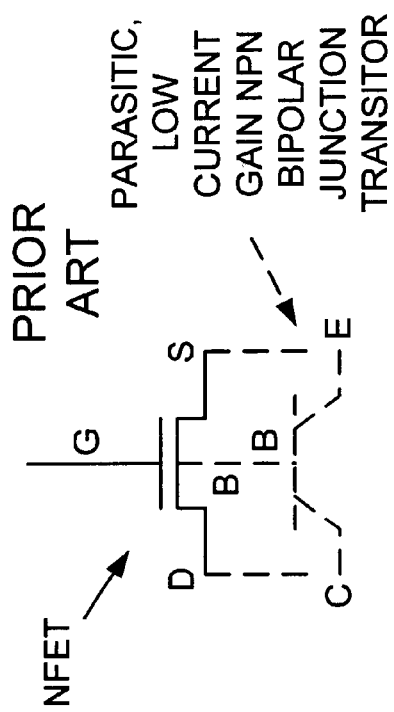
FIG. 2 is a schematic diagram illustrating the conventional silicon-on-insulator (SOI) N-channel field effect transistor (NFET) of FIG. 1 including a bipolar junction transistor.
Figure 3:
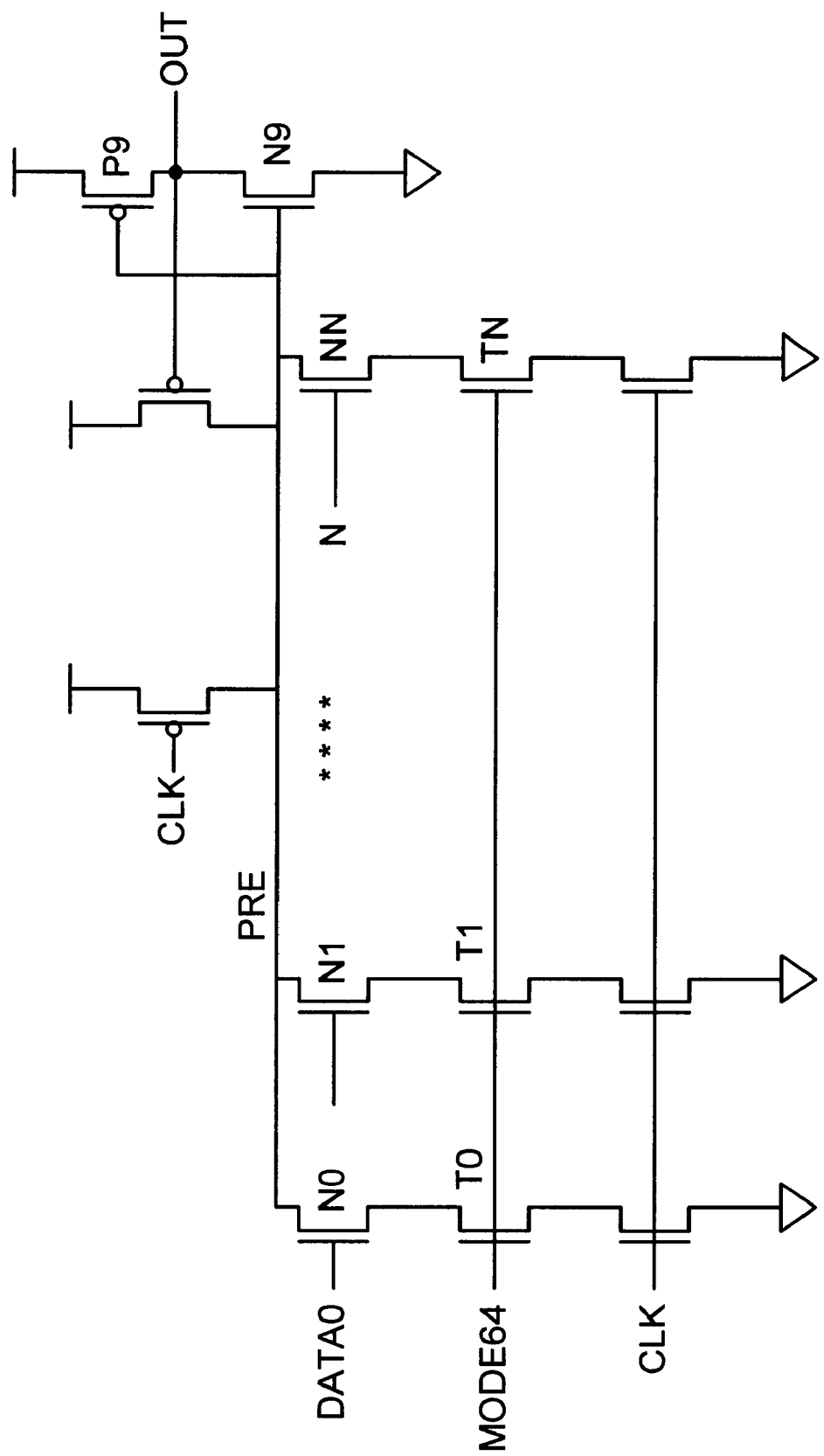
FIG. 3 is a schematic diagram illustrating a prior art Domino circuit used in a zero detection circuit.
Figure 4A:
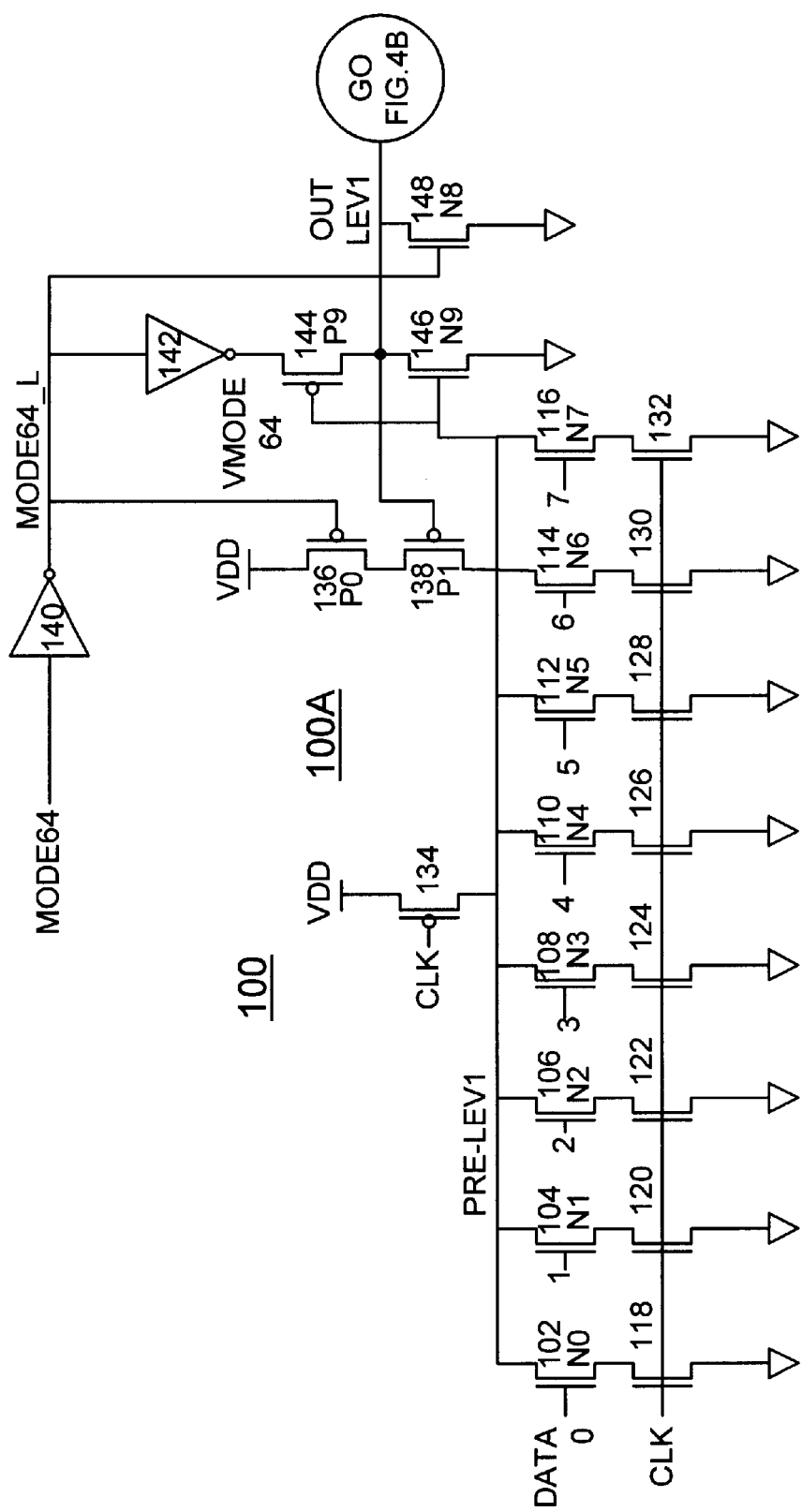
FIGS. 4A and 4B together provide a schematic diagram illustrating a silicon-on-insulator (SOI) zero detection circuit of the preferred embodiment.
Figure 4B:
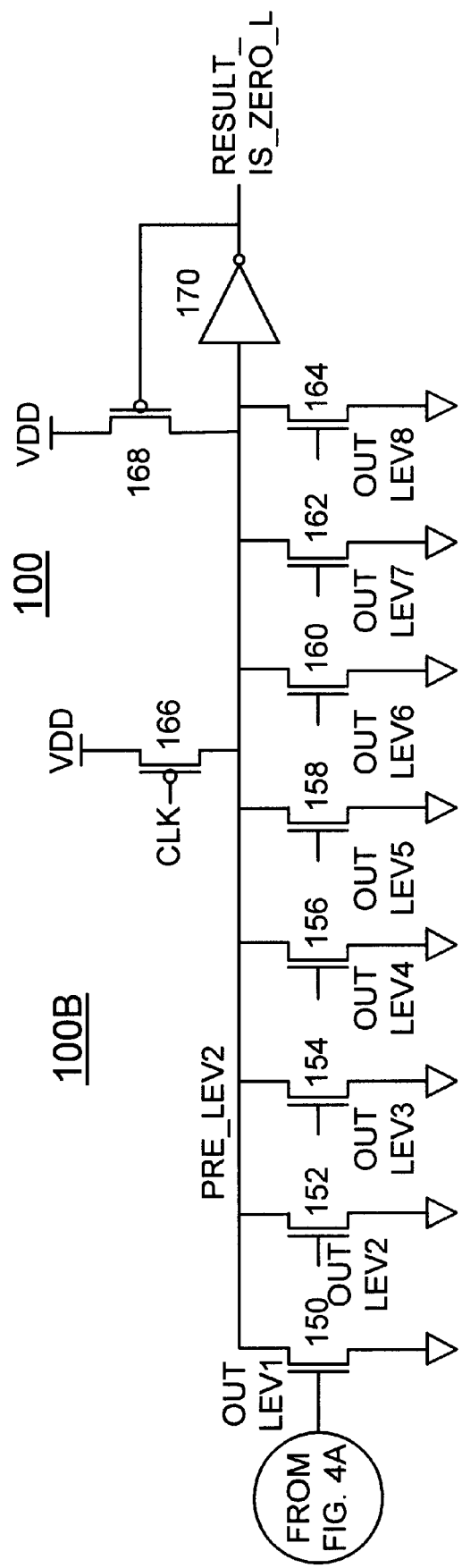

Referring to FIGS. 4A and 4B, there is shown a high speed microprocessor zero-detection circuit generally designated by the reference character 100 of the preferred embodiment. In accordance with features of the invention, high speed microprocessor zero-detection circuit 100 integrates the 32/64-bit selection into the output stage of the domino gate. A significant advantage is that the bipolar discharge problem is eliminated completely while maintaining the required high-speed circuit operation at the same time. Because the bipolar discharge effect is eliminated, N may be as large as necessary allowing the designer more flexibility in selecting it, and also the NMOS transistors may be sized as large as needed to meet the timing requirements. An additional benefit is the NMOS stack height is now two instead of the three in the prior art arrangement of FIG. 3, so some more speed is gained. A novel weak feedback scheme is also implemented for correct operation at any clock frequency.

In FIGS. 4A and 4B, high speed microprocessor zero-detection circuit 100 is shown as two stages of 8-wide Domino OR gates; so N has been chosen to be 8 for purposes of example in a first stage generally designated as 100A. It should be understood that the zero-detection circuit 100 could consist of a first stage that is 4-wide and a second stage that is 16-wide, as another example. The 32/64-bit selection has been incorporated into an output of the first stage 100A. Respective data 0–7 are applied to a gate input of silicon-on-insulator (SOI) N-channel field effect transistors NFETs N0–N7, 102, 104, 106, 108, 110, 112, 114 and 116. A clock input CLK is applied to a gate of silicon-on-insulator (SOI) NFETs 118, 120, 122, 124, 126, 128, 130 and 132 that are connected in a stack with NFETs N0–N7, 102, 104, 106, 108, 110, 112, 114 and 116. A clock input CLK is applied to a gate of silicon-on-insulator (SOI) P-channel field effect transistor PFET 134 that is connected between a supply voltage VDD and an intermediate node PRE_LEV1 and to the drain of NFETs N0–N7, 102, 104, 106, 108, 110, 112, 114 and 116. A pair of silicon-on-insulator (SOI) PFETs P0, P1, 136 and 138 are connected between the supply voltage VDD and intermediate node PRE_LEV1. A first inverter 140 receives MODE64 input and provides an output MODE64_L applied to the gate of PFET 136, P0 and applied to a second inverter 142. An output VMODE 64 of inverter 142 is applied to a source of PFET 144, P9 that is connected to the drains of NFETs 146 and 148, N9, N8 at an output node OUT LEV1. The gate of PFET P1, 138 is connected to node OUT LEV1. The gate of PFET 144, P9 is connected to the gate of NFET 146, N9 at intermediate node PRE LEV1. Reducing the stack height to two in this stage 100A completely eliminates the bipolar discharge problem because the bodies of NFETs N0–N7, 102, 104, 106, 108, 110, 112, 114 and 116 can never be charged very high, as CLK is turning on every cycle. The function of microprocessor zero-detection circuit 100 of FIGS. 4A and 4B is still the same as in FIG. 3. If MODE64=0 then the first stage 100A is disabled because MODE64_L is a 1 and NFET 148, N8 forces the output of the first stage, OUT_LEV1, to a 0. Inverter 142 prevents any contention between PFET 144, P9 and NFET N8, 148 because VMODE64 will be a 0, and PFET 144, P9 is not powered at its source. Thus, even if PRE_LEV1 is pulled low by one or more of the DATA pins, PFET 144, P9 will not fight NFET N8, 148, and the correct value of 0 is generated on OUT_LEV1. Then circuit 100A is disabled from taking part in the zero detection, DATA 0 to 7 are ignored.

If MODE64=1, then MODE64_L is a 0, VMODE64 is a 1, PFET 144, P9 is now powered at its source, the weak feedback branch consisting of PFETS, P0, P1 136, 138 is enabled, NFET N8, 148 is OFF, and the circuit 100A operates as a standard Domino circuit. If any of the DATA pins are high, then PRE_LEV1 is pulled low during the Evaluate phase, OUT_LEV1 is pulled high by PFET 144, P9 and the PMOS transistor in inverter 142, and the weak feedback branch is disabled by PFET 138, P1. This case is the regular evaluation of a Domino circuit. If all of the DATA pins are low, then PRE_LEV1 remains high, OUT_LEV1 remains low, and the weak feedback branch maintains this circuit in this state no matter how low the clock frequency is. Thus, whether or not the circuit 100A evaluates, it is taking part in the zero detection, with DATA 0 to 7 involved in the computation, and zero-detection circuit 100A is producing the correct result for both cases.

PFET 136, P0 is required to prevent possible contention, and the ensuing wasted power, between PFET 138, P1 and any of the NMOS stacks when one or more of the DATA pins are high, and the circuit should be disabled. Setting MODE64=0 will cause NFET 148, N8 to pull OUT_LEV1 down, which, if the source of PFET 138, P1 were connected to the supply Vdd, would cause both P1 and one or more of the NFET stacks to be on at the same time, causing the wasted power.

Referring to FIG. 4B, there is shown a second stage generally designated as 100B in accordance with the preferred embodiment. OUT LEV1 is applied to a gate of a silicon-on-insulator (SOI) NFET 150 connected between a node PRE_LEV2 and ground. Additional silicon-on-insulator (SOI) NFETs 152, 154, 156, 158, 160, 162 and 164 are gated by respective outputs of seven identical zero-detection circuits 100A. A clocked PFET 166 is connected between the supply voltage and node PRE_LEV2. A PFET 168 is connected between the supply voltage and node PRE_LEV2. An inverter 170 is connected at its input to node PRE_LEV2 and provides an output RESULT_IS_ZERO_L. The output of inverter 170 is applied to the gate of PFET 168.

While the present invention has been described with reference to the details of the embodiments of the invention shown in the drawing, these details are not intended to limit the scope of the invention as claimed in the appended claims.

What is claimed is:

1. A zero-detection circuit comprising:
   a plurality of transistor stacks, each transistor stack including an input transistor and a clocked transistor, each of said plurality of input transistors receiving a data input;
   an intermediate node connected to said plurality of transistor stacks;
   an output stage coupled to said intermediate node and providing an output; and
   said output stage including a bit selection control circuit receiving a bit selection signal; said bit selection control circuit providing a zero level output of said output stage responsive to a predefined bit selection signal.

2. A zero-detection circuit as recited in claim 1 wherein said input transistor and said clocked of said transistor stacks comprise a pair of silicon-on-insulator (SOI) transistors.

3. A zero-detection circuit as recited in claim 1 wherein said bit selection control circuit includes a first inverter receiving said bit selection signal and providing a gate input to an N-channel field effect transistor connected between said output of said output stage and ground potential.

4. A zero-detection circuit as recited in claim 3 wherein said bit selection control circuit includes a second inverter coupled to an output of said first inverter and providing a source input to a first P-channel field effect transistor having its drain connected to said output of said output stage and connected to a second N-channel field effect transistor, said second N-channel field effect transistor connected between said output of said output stage and ground potential and a gate of said P-channel field effect transistor and a gate of said second N-channel field effect transistor connected to said intermediate node.

5. A zero-detection circuit as recited in claim 4 wherein said bit selection control circuit includes a second P-channel field effect transistor and a third P-channel field effect transistor connected between a voltage supply and said intermediate node, a gate of said second P-channel field effect transistor coupled to an output of said first inverter and a gate of said third P-channel field effect transistor connected to said output of said output stage.

6. A zero-detection circuit as recited in claim 5 wherein said second P-channel field effect transistor is disabled responsive to said bit selection signal.

7. A zero-detection circuit as recited in claim 1 wherein said output is applied to a second stage; said second stage including a plurality of N-channel field effect transistors, each coupled between a second intermediate node and ground; and said output is applied to a gate of one of said plurality of N-channel field effect transistors.

8. A zero-detection circuit as recited in claim 7 wherein each of said plurality of N-channel field effect transistors comprise a silicon-on-insulator (SOI) transistor.

9. A zero-detection circuit comprising:

a plurality of transistor stacks, each transistor stack including an input transistor and a clocked transistor, each of said plurality of input transistors receiving a data input;

said input transistors and said clocked transistors comprising silicon-on-insulator (SOI) transistors;

an intermediate node connected to said plurality of transistor stacks;

an output stage coupled to said intermediate node and providing an output; and said output stage including a bit selection control circuit receiving a bit selection signal; said bit selection control circuit providing a zero level output of said output stage responsive to a predefined bit selection signal.

10. A zero-detection circuit as recited in claim 9 wherein said bit selection control circuit includes an N-channel field effect transistor connected between said output and ground and a gate of said N-channel field effect transistor receiving an inverted bit selection signal.

* * * * *